(12) United States Patent
Kwak et al.

(10) Patent No.: US 7,521,329 B2
(45) Date of Patent: Apr. 21, 2009

(54) SEMICONDUCTOR LIGHT EMITTING DIODE HAVING TEXTURED STRUCTURE AND METHOD OF MANUFACTURING THE SAME

(75) Inventors: Joon-seop Kwak, Hwaseong-si (KR); Jeong-wook Lee, Yongin-si (KR)

(73) Assignee: Samsung Electro-Mechanics Co., Ltd., Suwon-Si, Gyeonggi-Do (KR)

( * ) Notice: Subject to any disclaimer, the term of this patent is extended or adjusted under 35 U.S.C. 154(b) by 210 days.

(21) Appl. No.: 11/320,811

(22) Filed: Dec. 30, 2005

(65) Prior Publication Data

US 2006/0157719 A1    Jul. 20, 2006

(30) Foreign Application Priority Data

Dec. 31, 2004    (KR) .................. 10-2004-0117960

(51) Int. Cl.
   *H01L 21/8222*    (2006.01)
(52) U.S. Cl. .................. 438/328; 257/E21.368
(58) Field of Classification Search ........... 438/983, 438/380, 328; 257/E21.368
   See application file for complete search history.

(56) References Cited

U.S. PATENT DOCUMENTS 6,744,071 B2 *   6/2004   Sano et al. ................ 257/79

2003/0141512 A1   7/2003   Bruderl et al.
2004/0124427 A1   7/2004   Hsu et al.
2004/0150001 A1   8/2004   Shchukin et al.
2005/0205886 A1   9/2005   Murofushi et al.
2006/0118802 A1 * 6/2006   Lee et al. ................... 257/98

FOREIGN PATENT DOCUMENTS

WO    2004051758 A1    6/2004

OTHER PUBLICATIONS

Venugopalan, H.S., et al., "*Morphology of nickel and nickel/gold contacts to gallium nitride*", J. Vac. Sci. Technol. A., Mar./Apr. 1998, pp. 607-610, 16(2), American Vacuum Society, New York, NY.
European Search Report dated Jan. 21, 2009.

* cited by examiner

*Primary Examiner*—Thao X Le
*Assistant Examiner*—Elias Ullah
(74) *Attorney, Agent, or Firm*—Buchanan Ingersoll & Rooney PC

(57) ABSTRACT

A semiconductor light emitting diode having a textured structure and a method of manufacturing the semiconductor light emitting diode are provided. The method includes forming a first semiconductor layer on a substrate; forming a textured structured first semiconductor layer by penetrating a material of a material layer into the first semiconductor layer after the material layer is formed on the first semiconductor layer and is annealed; and forming a second semiconductor layer on the first semiconductor layer.

14 Claims, 6 Drawing Sheets

SEMICONDUCTOR LIGHT EMITTING DIODE HAVING TEXTURED STRUCTURE AND METHOD OF MANUFACTURING THE SAME

CROSS-REFERENCE TO RELATED PATENT APPLICATION

This application claims the benefit of Korean Patent Application No. 10-2004-00117960, filed on Dec. 31, 2004, in the Korean Intellectual Property Office, the disclosure of which is incorporated herein in its entirety by reference.

BACKGROUND OF THE DISCLOSURE

1. Field of the Disclosure

The present invention relates to a semiconductor light emitting diode, and more particularly, to a semiconductor light emitting diode having a textured structure to improve the light extraction efficiency and a method of manufacturing the same.

2. Description of the Related Art

A light emitting diode (LED) is a device used for converting electrical energy into infra red rays, visible light, or other light using the characteristics of a compound semiconductor. The light emitting diode is a kind of electro luminescent (EL) device, and at the present time the light emitting diodes that employ an III-V group compound semiconductor are being practically used.

The III-V group compound semiconductor is a direct transition type semiconductor, and is widely used for LEDs or laser diodes (LDs) since it provides stable operation at a higher temperature than devices that use other semiconductors. The III-V group compound semiconductor is typically formed on a substrate formed of sapphire $Al_2O_3$ or SiC. To improve light emission efficiency, or light extraction efficiency, LEDs having a variety of structures have been studied. Current studies utilize a textured structure on a light extraction region of the LED to improve the light extraction efficiency.

At an interface between material layers having different refractive indexes, the passing of light is interrupted by different refractive indexes of the material layers. In the instance of a flat interface, when light passes from a semiconductor layer having a greater refractive index (n=2.5) into an air layer having a smaller refractive index (n=1), the light must enter the flat interface at less than a predetermined angle with respect to the normal to the flat surface. If the light enters at an angle greater than the predetermined angle, the light internally reflects in its totality at the flat interface, thereby greatly reducing the light extraction efficiency. To avoid the total internal reflection of light, a method of incorporating a textured structure at the interface has been attempted.

FIGS. 1A and 1B are cross-sectional views illustrating a conventional light emitting diode having a textured structure. Referring to FIG. 1A, a p-GaN layer 102, an active layer 103, an n-GaN layer 104 are sequentially formed on a p-electrode 101, and an n-electrode 105 is formed on the n-GaN layer 104. When light generated by the active layer 103 is extracted upward through the n-GaN layer 104, a textured structure 106 is incorporated at an interface between the n-GaN layer 104 and the air layer to change the incidence angle of the light.

Referring to FIG. 1B, an n-GaN layer 112 is formed on a sapphire substrate 111, and an n-AlGaN layer 113, an active layer 114, a p-AlGaN layer 115, a p-GaN layer 116, and a p-electrode 117 are sequentially formed on a region of the n-GaN layer 112. An n-electrode 118 is formed on a region of the n-GaN layer 112 where the n-AlGaN layer 113 is not formed. This is a flip-chip structure in which light generated by the active layer 114 is primarily extracted through the transparent sapphire substrate 111. Here, the light extraction efficiency is improved by forming a textured structure 120 on the surface of the sapphire substrate 111.

A conventional semiconductor light emitting diode incorporates the textured structure 120 to improve the light extraction efficiency. However, particularly as depicted in FIG. 1B, when the textured structure 120 is incorporated by patterning the sapphire substrate 111, the growth of a uniform semiconductor layer on the sapphire substrate 111 is difficult because the unmatched crystal structure between the sapphire substrate 111 and the semiconductor layer is likely to cause defects in the semiconductor layer, thereby reducing the light extraction efficiency.

SUMMARY OF THE DISCLOSURE

The present invention may provide a semiconductor light emitting diode having a structure that can increase light extraction efficiency and reduce inter crystal defects of the semiconductor light emitting diode and a method of manufacturing the same.

According to an aspect of the present invention, there is provided a method of manufacturing a semiconductor light emitting diode, comprising: forming a first semiconductor layer on a substrate; forming a textured structure first semiconductor layer by penetrating a material of a material layer into the first semiconductor layer after the material layer is formed on the first semiconductor layer and is annealed; and forming a second semiconductor layer on the first semiconductor layer.

The forming of a textured structured first semiconductor layer may comprise: forming a first material layer on the first semiconductor layer; forming a second material layer on the first material layer; and annealing to cause the materials of the first and second material layers to penetrate into the first semiconductor layer.

The first material layer may be formed of a material including one of Ni and Pd.

The second material layer may be formed of a material including one of Ag and Au.

The method may further comprise etching the first semiconductor layer to remove Au from the first semiconductor layer using aqua regia, after the materials of the first material layer and the second material layer have penetrated into the first semiconductor layer.

The forming of a textured structured first semiconductor layer may comprise annealing to cause the material layers to penetrate into defected regions of the first semiconductor layer after the material layers are formed.

The method may further comprise removing the material penetrated into the first semiconductor layer from the first semiconductor layer, depositing one of $SiO_2$ and SiN on the first semiconductor layer, and leaving $SiO_2$ or SiN only in the textured structure of the first semiconductor layer by treating a surface of the first semiconductor layer.

The annealing may be performed under a nitrogen atmosphere.

The method may further comprise annealing under an oxygen atmosphere after annealing under the nitrogen atmosphere.

The first semiconductor layer may be formed of a compound having a formula $In_xAl_yGa_{1-x-y}N_{1-x-y}$ ($0 \leq x \leq 1$, $0 \leq y \leq 1$, $x+y \leq 1$) undoped, doped with an n-type dopant, or doped with a p-type dopant.

The first semiconductor layer may have a thickness of approximately 10 nm to 5 μm.

According to another aspect of the present invention, there may be provided a semiconductor light emitting diode comprising: a first semiconductor layer formed in a textured structure; a material region which is formed between the textured structures of the first semiconductor layer and includes at least one metal selected from Ni, Pd, Au, and Ag; and a second semiconductor layer, an active layer, and a third semiconductor layer sequentially formed on the first semiconductor layer and the intermediate layer.

The first semiconductor layer may be formed of a compound having a formula $In_xAl_yGa_{1-x-y}N_{1-x-y}(0 \leq x \leq 1, 0 \leq y \leq 1, x+y \leq 1)$ undoped, doped with an n-type dopant, or doped with a p-type dopant.

The first semiconductor layer may have a thickness of approximately 10 nm to 5 μm.

BRIEF DESCRIPTION OF THE DRAWINGS

The above and other features and advantages of the present invention are described in detailed exemplary embodiments thereof with reference to the attached drawings in which.

DETAILED DESCRIPTION OF EXEMPLARY EMBODIMENTS

The present invention will now be described more fully with reference to the accompanying drawings in which exemplary embodiments of the invention are shown.

Figure 1A:
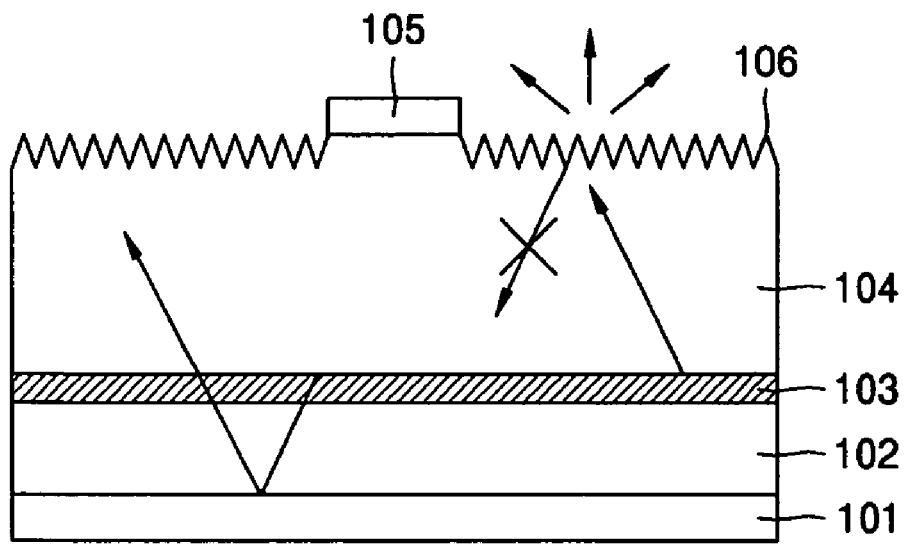
FIGS. 1A and 1B are cross-sectional views of conventional semiconductor light emitting diodes having a textured structure.
Figure 1B:
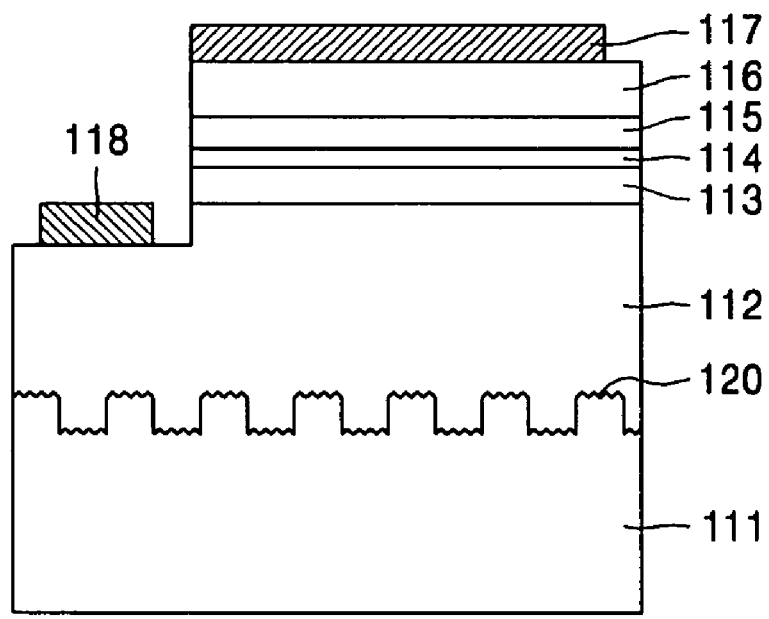
Figure 2:
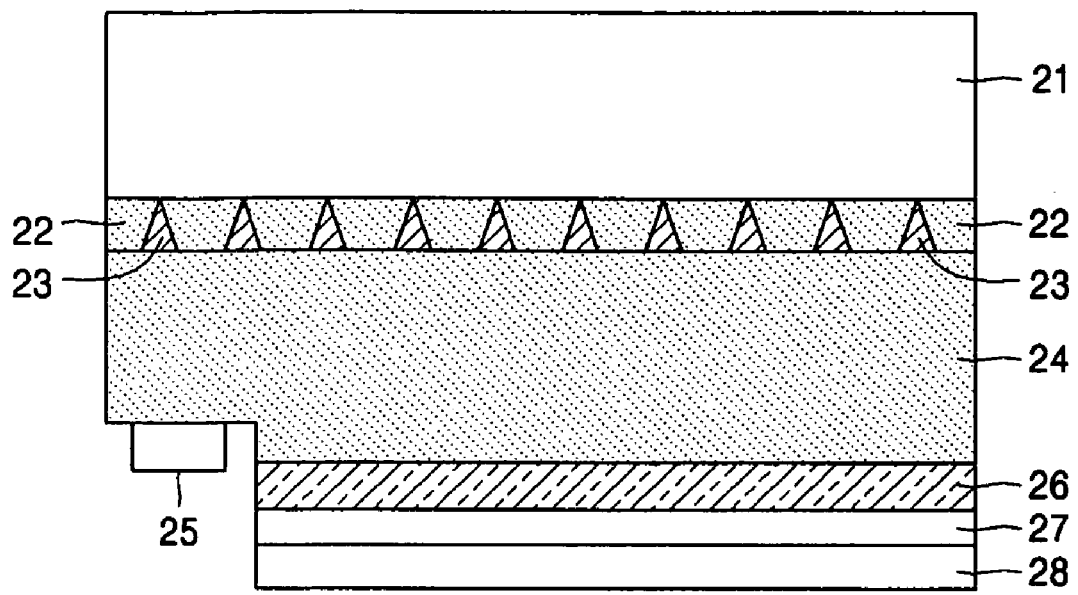
FIGS. 2 and 3 are cross-sectional views of semiconductor light emitting diodes having a textured structure according to an embodiment of the present invention.
Figure 3:
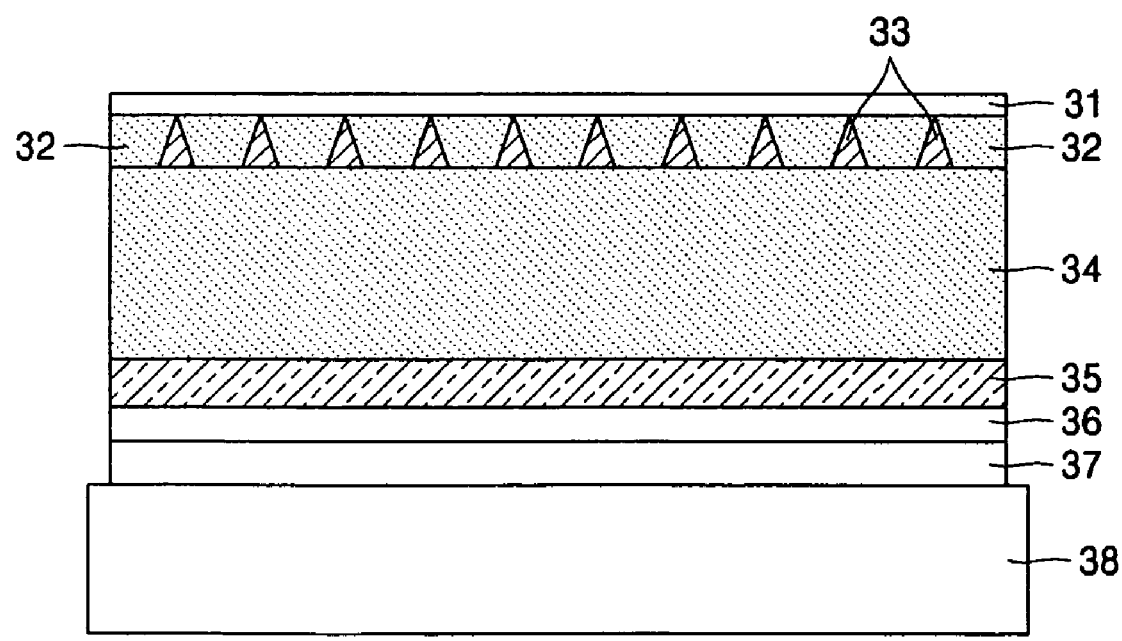

FIGS. 2 and 3 are cross-sectional views of semiconductor light emitting diodes having a textured structure according to an embodiment of the present invention. In the detailed description of the present invention, a material region formed on a region between each of the textured shapes of a semiconductor layer having a textured structure is termed an intermediate layer.

FIG. 2 shows a textured structure applied to a flip-chip type semiconductor light emitting diode, and FIG. 3 shows a textured structure applied to a vertical type semiconductor light emitting diode. The textured structure can be selectively formed, and the textured structure is commonly formed on a region where light generated by an active layer is emitted.

Referring to FIG. 2, a first semiconductor layer 22 and an intermediate layer 23 are formed on a transparent substrate 21 formed of sapphire $Al_2O_3$. Here, the first semiconductor layer 22 has a textured structure, and a second semiconductor layer 24 is formed on the first semiconductor layer 22. An active layer 26, a third semiconductor layer 27, and a second electrode 28 are sequentially formed on a region of the second semiconductor layer 24. A first electrode 25 is formed on another region of the second semiconductor layer 24 where the active layer 26 is not formed.

Hereafter exemplary materials for forming the layers are provided. The transparent substrate 21 can be a sapphire substrate, which is widely used. The first and second semiconductor layers 22 and 24 can be formed of a compound having a formula $In_xAl_yGa_{1-x-y}N_{1-x-y}(0 \leq x \leq 1, 0 \leq y \leq 1, x+y \leq 1)$ undoped, doped with an n-type dopant, or doped with a p-type dopant. The intermediate layer 23 can be formed of an oxide containing at least one selected from Ni, Pf, Ag, and Au. The active layer 26 can be formed of a material typically used for forming a semiconductor laser diode in a multi-layer structure of a multi-quantum barrier structure. The third semiconductor layer 27 can be formed of a compound having a formula $In_xAl_yGa_{1-x-y}N_{1-x-y}(0 \leq x \leq 1, 0 \leq y \leq 1, x+y \leq 1)$ undoped, doped with an n-type dopant, or doped with a p-type dopant. Here, when the first semiconductor layer 22 is formed of an n-type or p-type conductive material, the third semiconductor layer 27 is formed of a p-type material. The first electrode 25 is formed of an n-type or p-type conductive material, and the second electrode 28 is formed of a conductive material having the opposite polarity to the first electrode 25.

As shown in FIG. 2, in the semiconductor light emitting diode according to an embodiment of the present invention, the textured structure has the intermediate layer 23 within a region where the first semiconductor layer 22 is patterned to a textured shape. The distances between the textured patterns of the first semiconductor layer 22 are not equal, but are determined by defects in the first semiconductor layer 22, particularly by screw dislocations. The first semiconductor layer 22 may be formed to a thickness of approximately 10 nm to 5 μm. According to the structure of the semiconductor light emitting diode of FIG. 2, the crystal defects in the semiconductor light emitting diode can be reduced by forming the intermediate layer 23 on the defect region of the first semiconductor layer 22 and the second semiconductor layer 24 is formed on the first semiconductor layer 22 and the intermediate layer 23. Also, the extraction efficiency of light generated by the active layer 26 to the outside can be increased by incorporating the textured structure.

FIG. 3 shows a vertical type semiconductor light emitting diode having a textured structure according to an embodiment of the present invention. Referring to FIG. 3, a second electrode 37, a third semiconductor layer 36, an active layer 35, and a second semiconductor layer 34 are sequentially formed on a lower structure 38. A first semiconductor layer 32 and an intermediate layer 33 patterned to a texturing shape are formed on the second semiconductor layer 34. A first electrode 31 is formed on the first semiconductor layer 32 and the intermediate layer 33.

Representative materials for forming the layers of the vertical type semiconductor light emitting diode as depicted in FIG. 3 are indicated hereafter. The first semiconductor layer 32 and the second semiconductor layer 34 can be formed of a compound having a formula $In_xAl_yGaN_{1-x-y}(0 \leq x \leq 1, 0 \leq y \leq 1, x+y \leq 1)$ undoped, doped with an n-type dopant, or doped with a p-type dopant. The intermediate layer 33 can be formed of a material including at least one metal selected from Ni, Pd, Au, and Ag. The active layer 35 can be formed of a material typically used for forming a semiconductor laser diode in a multi-layer structure of a multi-quantum barrier structure. The first electrode 31 and the second electrode 37 can be formed of a conductive material.

As shown in FIG. 2, the textured structure according to an embodiment of the present invention has the intermediate layer 33 within a region of the first semiconductor layer 32 patterned to the textured shape. Here, as in the flip-chip type device shown in FIG. 2, the distances between the textured patterns of the first semiconductor layer 32 are not equal, but are determined by defects in the first semiconductor layer 32, particularly by screw dislocations. According to the structure of the semiconductor light emitting diode according to the embodiment of the present invention, crystal defects in the semiconductor light emitting diode can be reduced by forming the intermediate layer 33 on the defect region of the first semiconductor layer 32 with the second semiconductor layer 24 being formed on the intermediate layer 33, and also the extraction efficiency of light generated by the active layer 35 to the outside can be increased by incorporating the textured structure.

A method of manufacturing a semiconductor light emitting diode having a textured structure according to an embodiment will now be described with reference to FIGS. 4A through 4C. Processes for forming the textured structure of the semiconductor light emitting diode, which is an aspect of the present invention, will be described in detail. The descriptions of processes for forming an active layer and electrodes are omitted, since they are well known in the art.

Figure 4A:
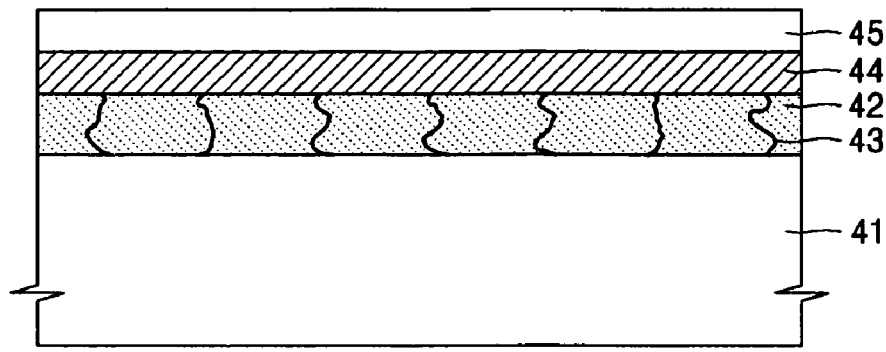
FIGS. 4A through 4C are cross-sectional views for illustrating a method of manufacturing a semiconductor light emitting diode according to an embodiment of the present invention.
Figure 4B:
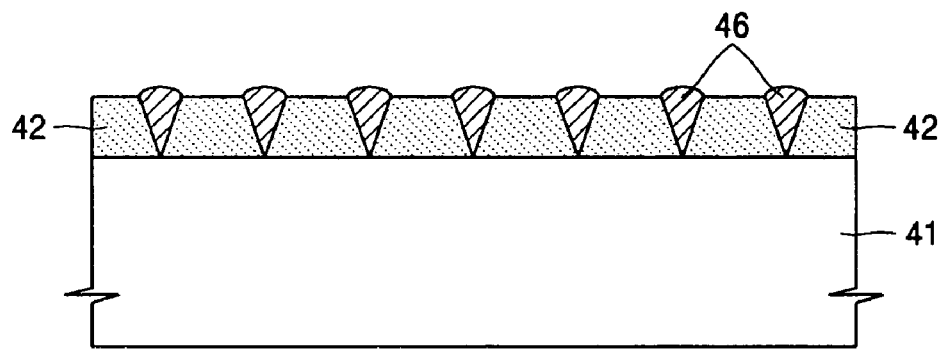
Figure 4C:
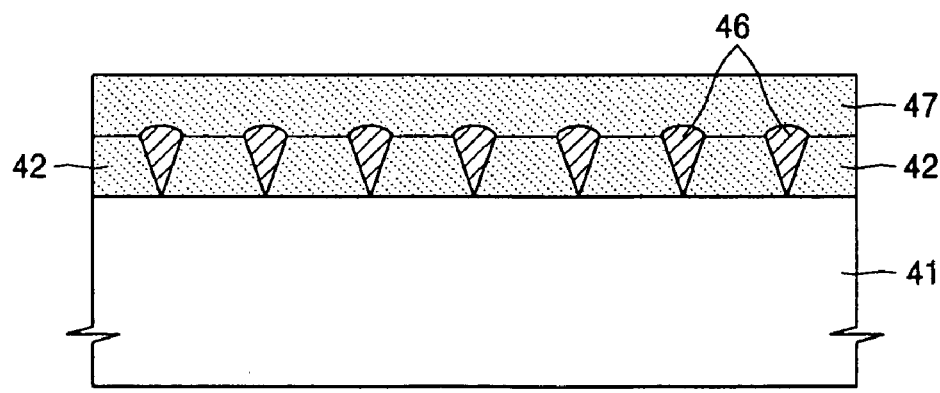

FIGS. 4A through 4C are cross-sectional views for illustrating a method of manufacturing a semiconductor light emitting diode according to an embodiment of the present invention. Referring to FIG. 4A, a first semiconductor layer 42 is formed on a substrate 41. Here, the substrate 41 is generally a sapphire substrate (refractive index n=1.78). The first semiconductor layer 42 is formed of a compound having a formula $In_xAl_yGaN_{1-x-y}$ ($0 \leq x \leq 1$, $0 \leq y \leq 1$, $x+y \leq 1$) undoped, doped with an n-type dopant, or doped with a p-type dopant to a thickness of approximately 10 nm to 5 μm. Next, a first material layer 44 and a second material layer 45 are formed on the first semiconductor layer 42. The purpose of the first and second material layers 44 and 45 is to form the intermediate layer 23 or 33 of FIGS. 2 and 3, and the first and second material layers 44 and 45 can be formed of a material including at least one metal selected from Ni, Au, Ag, and Pd. Typically, crystal defects are generated in the first semiconductor layer 42 formed on the substrate 41, with screw dislocations being formed perpendicular to the first semiconductor layer 42 on the substrate 41. The screw dislocations are formed internally due to a crystal structure difference between the sapphire typically used for forming the substrate 41 and the first semiconductor layer 42 formed of GaN.

Next, referring to FIG. 4B, a rapid thermal annealing (RTA) process is performed on the resultant product. The RTA process is preferably performed at a high temperature of approximately 800° C. under a nitrogen atmosphere. Low temperature annealing under an oxygen atmosphere can be selectively performed in addition to the RTA process. The annealing process causes the first and second material layers 44 and 45 to agglomerate and penetrate into the crystal defects 43 of the first semiconductor layer 42. Thus, as depicted in FIG. 4B, a structure in which the intermediate layer 46 is formed in the first semiconductor layer 42 can be obtained. The intermediate layer 46 becomes NiO and NiO/Ag. A Ga oxide formed by an oxidation process can also be included. The detailed technical descriptions have been disclosed in Morphology of Nickel and Nickel/Gold Contacts to Gallium Nitride by H. S. Venugopalan et. al, in J.Vac. Sci.Technol. A16(2), March/April 1998.

Next, as depicted in FIG. 4C, a second semiconductor layer 47 is formed on the first semiconductor layer 42 and the intermediate layer 46. At this time, the second semiconductor layer 47 is formed of a material having a crystal structure at least similar to that of the first semiconductor layer 42, and is grown to coat both the first semiconductor layer 42 and the intermediate layer 46 by selectively growing from regions of the first semiconductor layer 42. After the textured structure as described above is formed, elements of the semiconductor light emitting diode depicted in FIG. 2, such as an active layer and a third semiconductor layer, can be readily formed by conventional methods.

A process for forming a textured structure of a semiconductor light emitting diode according to another embodiment of the present invention will now be described with reference to FIGS. 5A through 5D.

Figure 5A:
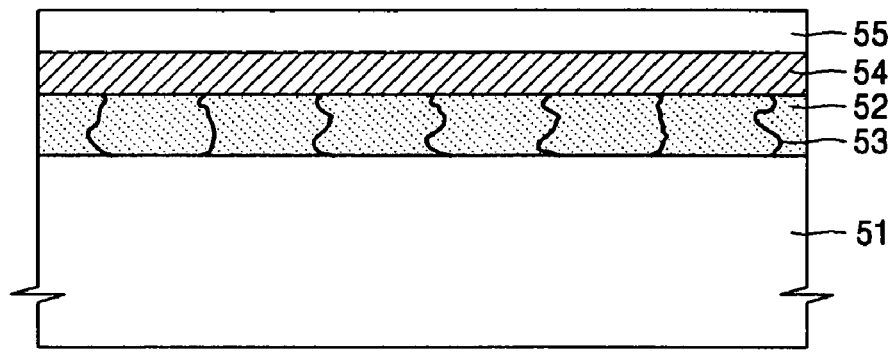
FIGS. 5A through 5D are cross-sectional views for illustrating a method of manufacturing a semiconductor light emitting diode according to another embodiment of the present invention.

Referring to FIG. 5A, a first semiconductor layer 52 is formed on a substrate 51. The first semiconductor layer 52 is formed of $In_xAl_yGa_{1-x-y}N_{1-x-y}$ ($0 \leq x \leq 1$, $0 \leq y \leq 1$, $x+y \leq 1$) undoped, doped with an n-type dopant, or doped with a p-type dopant, to a thickness of approximately 10 nm to 5 μm. Next, first and second material layers 54 and 55 are formed on the first semiconductor layer 52. The first and second material layers 54 and 55 can be formed of a material including at least one metal selected from Ni, Pd, Ag, and Au. Crystal defects such as dislocations are typically generated in the first semiconductor layer 52 formed on the substrate 51, particularly screw dislocations, which affect the characteristics of the semiconductor light emitting diode. The crystal defects such as the screw dislocations are caused by the difference in crystal structure between the sapphire used for forming the substrate 51 and GaN used for forming the first semiconductor layer 52.

Figure 5B:
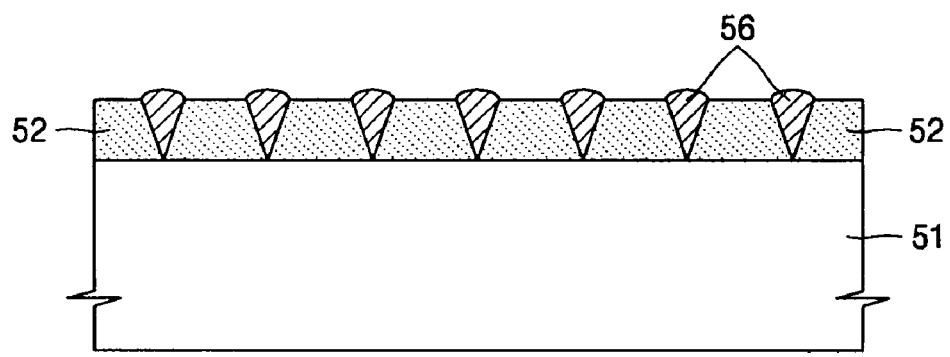

Referring to FIG. 5B, a rapid thermal annealing (RTA) process is performed on the resultant product. The RTA process is preferably performed at a high temperature of approximately 800° C. under a nitrogen atmosphere. Low temperature annealing under an oxygen atmosphere can be selectively performed in addition to the RTA process. The annealing process induces the first and second material layers 54 and 55 to agglomerate and penetrate into the crystal defects 53 of the first semiconductor layer 52. Thus, as depicted in FIG. 5B, a structure can be obtained in which an intermediate layer 56 is formed in the first semiconductor layer 52. For example, when the first material layer 54 is formed of Ni and the second material layer is formed of Au, the intermediate layer 56 can be NiO (or NiO+Ga oxide)/Ag (or AuGu).

Figure 5C:
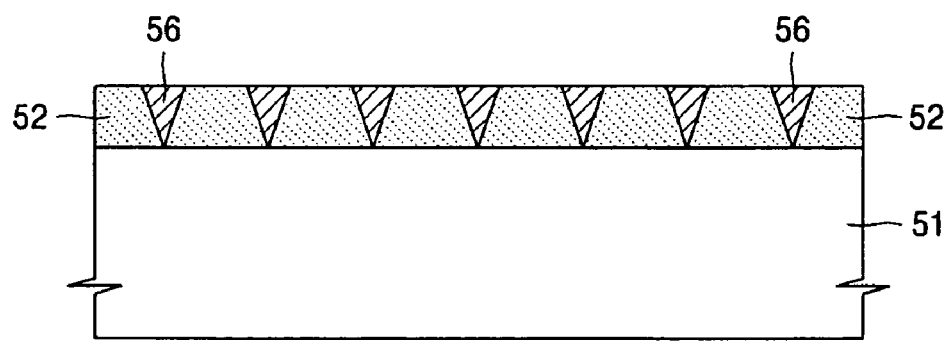

Next, as depicted in FIG. 5C, Au can be selectively removed from the intermediate layer 56 by using aqua regia for example. This is because Au has a high light absorption rate and may adversely affect the characteristics of the semiconductor light emitting diode when used to form the second material layer 55.

Figure 5D:
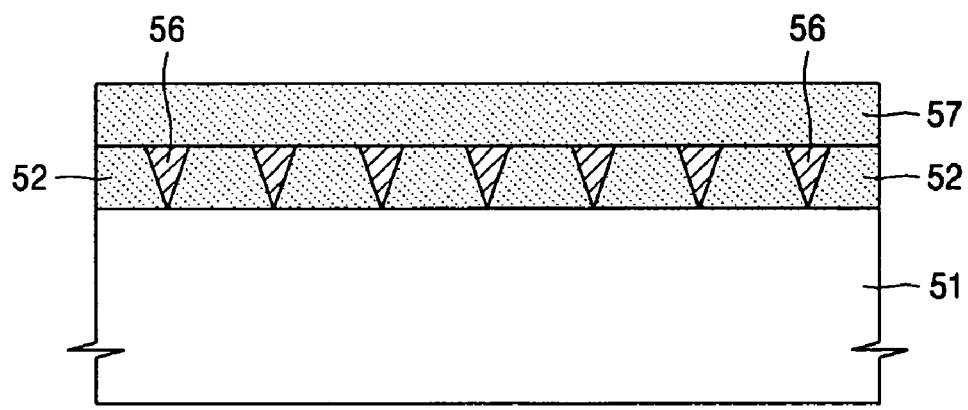

Also, as depicted in FIG. 5D, a second semiconductor layer 57 is formed on the first semiconductor layer 52 and the intermediate layer 56. At this time, the second semiconductor layer 57 is formed of a material having a crystal structure at least similar to that of the first semiconductor layer 52, and is grown to coat both the first semiconductor layer 52 and the intermediate layer 56 by selectively growing from regions of the first semiconductor layer 52. After the textured structure as described above is formed, elements of the semiconductor light emitting diode depicted in FIG. 2, such as an active layer and a third semiconductor layer, can be readily formed by conventional methods.

A process for forming a textured structure of a semiconductor light emitting diode according to still another embodiment of the present invention will now be described with reference to FIGS. 6A through 6E.

Figure 6A:
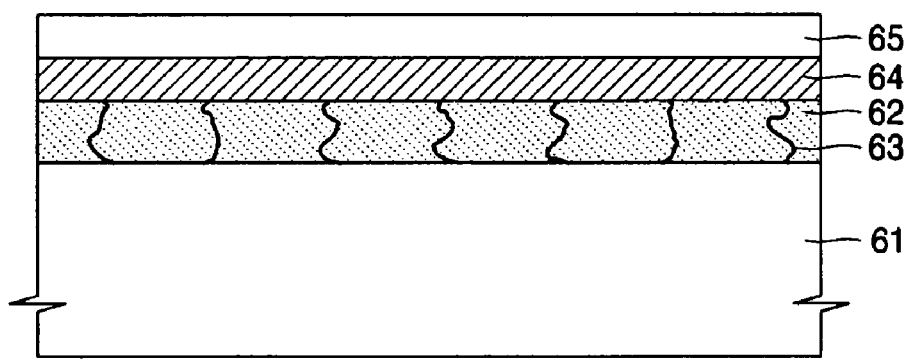
FIGS. 6A through 6E are cross-sectional views for illustrating a method of manufacturing a semiconductor light emitting diode according to still another embodiment of the present invention.

Referring to FIG. 6A, a first semiconductor layer 62 is formed on a substrate 61. Here, the first semiconductor layer 62 is formed of a compound having a formula $In_xAl_yGa_{1-x-y}N_{1-x-y}$ ($0 \leq x \leq 1$, $0 \leq y \leq 1$, $x+y \leq 1$) undoped, doped with an n-type dopant, or doped with a p-type dopant to a thickness of approximately 10 nm to 5 μm. Next, first and second material layers 64 and 65 are formed on the first semiconductor layer 62. The first and second material layers 64 and 65 can be formed of a material including at least one metal selected from Ni, Pd, Ag, and Au. Crystal defects such as dislocations are typically generated in the first semiconductor layer 62 formed on the substrate 61, particularly, screw dislocations affect to the characteristics of the semiconductor light emitting diode. As described above, the crystal defects such as screw dislocations are caused by the difference in crystal structure between the sapphire used for forming the substrate 61 and the GaN used for forming the first semiconductor layer 62.

Figure 6B:
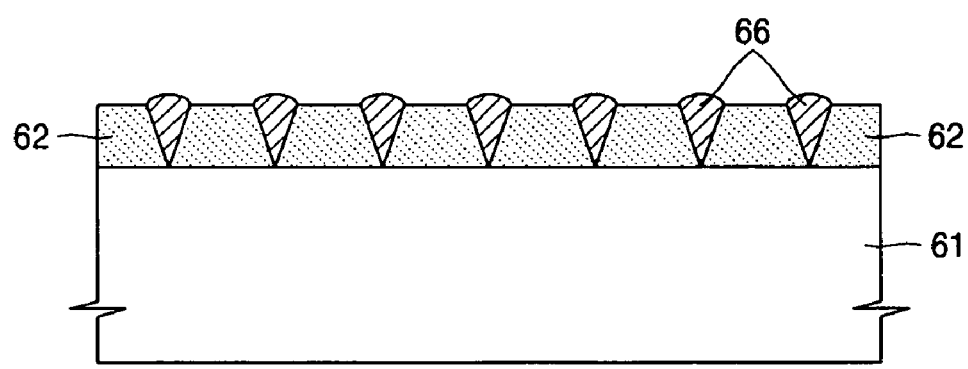

Referring to FIG. 6B, a rapid thermal annealing (RTA) process is performed on the resultant product. The RTA process is preferably performed at a high temperature of approximately 800° C. under a nitrogen atmosphere. Low temperature annealing under an oxygen atmosphere can be selectively performed in addition to the RTA process. The annealing process induces the first and second material layers 64 and 65 to agglomerate and penetrate into the crystal defects 63 of the first semiconductor layer 62. Thus, as depicted in FIG. 6B, a structure can be obtained in which an intermediate layer 66 is formed in the first semiconductor layer 62.

Figure 6C:
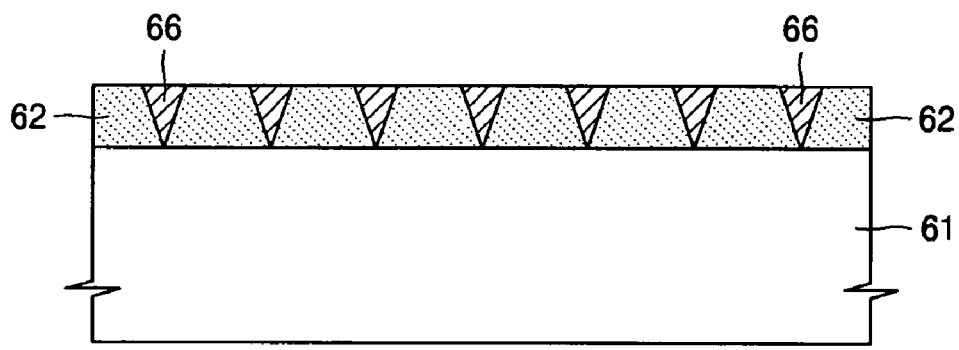

Next, referring to FIG. 6C, the intermediate layer 66 is removed by wet etching. By removing the entire intermediate layer 66, only the first semiconductor layer 62 remains on the substrate 61.

Figure 6D:
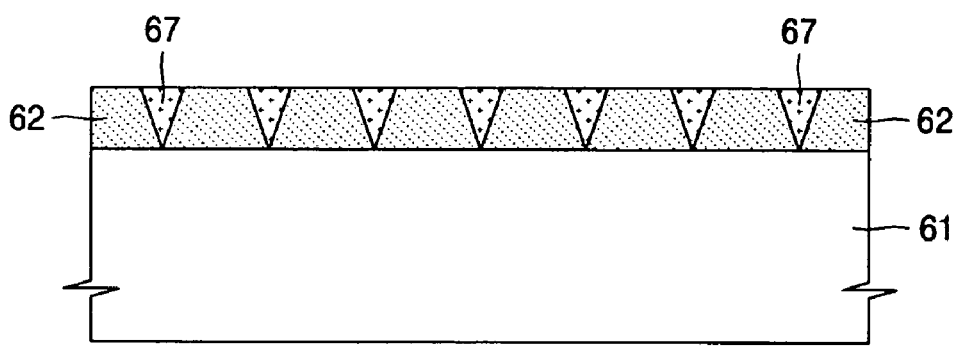

Referring to FIG. 6D, a second intermediate layer 67 is formed by performing a planarizing process after $SiO_2$ or SiN is coated on the first semiconductor layer 62.

Figure 6E:
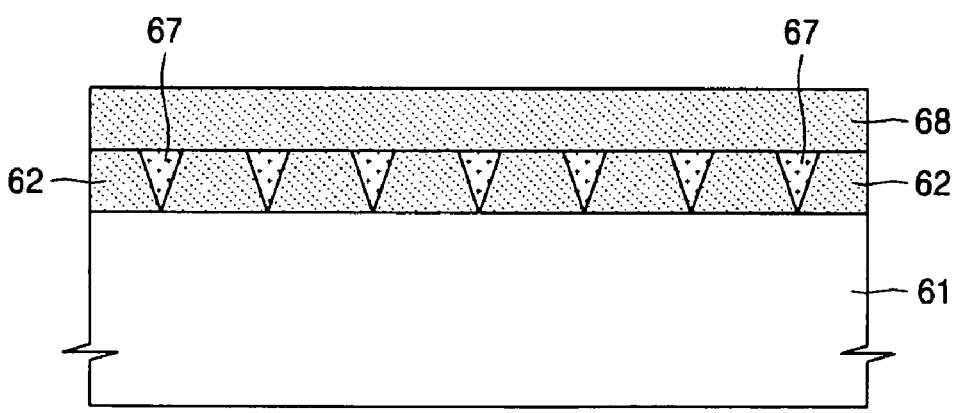

Referring to FIG. 6E, a second semiconductor layer 68 is formed on the first semiconductor layer 6 and the second intermediate layer 67. At this time, the second semiconductor layer 68 is formed of a material having a crystal structure at least similar to that of the first semiconductor layer 62, and is grown to coat both the first semiconductor layer 62 and the second intermediate layer 67 by selectively growing from regions of the first semiconductor layer 62. After the textured structure as described above is formed, elements of the semiconductor light emitting diode depicted in FIG. 2, such as an active layer and a third semiconductor layer, can be readily formed by conventional methods.

Through the methods of manufacturing a semiconductor light emitting diode according to the embodiments of the present invention, a first semiconductor layer having a textured structure is formed on a light emitting region of the semiconductor light emitting diode.

According to the present invention, the extraction efficiency of light generated by an active layer can be greatly improved by forming a textured structure pattern in a semiconductor layer of the semiconductor light emitting diode, and stable operation can be achieved by reducing internal defects of the semiconductor device, thereby improving the lifespan of the semiconductor light emitting diode.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A method of manufacturing a semiconductor light emitting diode, comprising:
forming a first semiconductor layer on a substrate;
forming a textured structure first semiconductor layer having first and second material layers by penetrating the material layers into the first semiconductor layer after the material layers are formed on the first semiconductor layer and are annealed; forming a second semiconductor layer on the first semiconductor layer; and etching the first semiconductor layer to remove the second material layer from the first semiconductor layer after the first material layer and the second material layer have penetrated into the first semiconductor layer.

2. The method of claim 1, wherein the forming of the textured structured first semiconductor layer comprises:
forming the first material layer on the first semiconductor layer;
forming the second material layer on the first material layer; and
annealing to cause the first and second material layers to penetrate into the first semiconductor layer.

3. The method of claim 2, wherein the first material layer is formed of one selected from Ni and Pd.

4. The method of claim 2, wherein the second material layer is formed of one selected from Ag and Au.

5. The method of claim 2, wherein the forming of a textured structured first semiconductor layer comprises annealing to cause the material layers to penetrate into a defect region of the first semiconductor layer after the material layers are formed.

6. The method of claim 5, further comprising removing the material penetrated into the first semiconductor layer from the first semiconductor layer, depositing one of $SiO_2$ and SiN on the first semiconductor layer, and leaving $SiO_2$ or SiN only in the textured structure of the first semiconductor layer by treating a surface of the first semiconductor layer.

7. The method of claim 5, wherein the annealing is performed under a nitrogen atmosphere.

8. The method of claim 7, further comprising annealing under an oxygen atmosphere after annealing under the nitrogen atmosphere.

9. The method of claim 1, wherein the first semiconductor layer is formed of a compound having a formula $In_xAl_yGa_{1-x-y}N_{1-x-y}$ ($0 \leq x \leq 1$, $0 \leq y \leq 1$, $x+y \leq 1$) undoped, doped with an n-type dopant, or doped with a p-type dopant.

10. The method of claim 1, wherein the first semiconductor layer has a thickness of approximately 10 nm to 5 μm.

11. A method of manufacturing a semiconductor light emitting diode comprising:
forming a first semiconductor layer on a substrate;
forming a textured structure first semiconductor layer by penetrating a material of a material layer into the first semiconductor layer after the material layer is formed on the first semiconductor layer and is annealed; and
forming a second semiconductor layer on the first semiconductor layer;
wherein the forming of the textured structured first semiconductor layer comprises:
forming a first material layer on the first semiconductor layer;
forming a second material layer of a material selected from Ag and An on the first material layer; and annealing to cause the first and second material layers to penetrate into the first semiconductor layer etching the first semiconductor layer to remove Au from the first semiconductor layer using aqua regia after the materials of the first material layer and the second material layer have penetrated into the first semiconductor layer.

12. A semiconductor light emitting diode comprising:
a first semiconductor layer formed in a textured structure;
a material region having first and second material layers which is formed between the textured structures of the first semiconductor layer wherein the first and second material layers include at least one metal selected from Ni, Pd, Au, and Ag; a second semiconductor layer; and active layer, and a third semiconductor layer sequentially formed on the first semiconductor layer and the material region when the first semiconductor layer is etched to remove at least one metal of the second material layer from the first semiconductor layer after the at least one metal of the second material layer has penetrate into the first semiconductor layer.

13. The semiconductor light emitting diode of claim 12, wherein the first semiconductor layer is formed of a compound having a formula $In_xAl_yGa_{1-x-y}N_{1-x-y}$ ($0 \leq x \leq 1$, $0 \leq y \leq 1$, $x+y \leq 1$), undoped, doped with an n-type dopant, or doped with a p-type dopant.

14. The semiconductor light emitting diode of claim 12, wherein the first semiconductor layer has a thickness of approximately 10 nm to 5 μm.

* * * * *